(12) United States Patent
Lohneis

(10) Patent No.: US 8,979,290 B2
(45) Date of Patent: *Mar. 17, 2015

(54) THREE-DIMENSIONAL LIGHTING STRUCTURE UTILIZING LIGHT ACTIVE TECHNOLOGY

(76) Inventor: Paul E. Lohneis, Potomac, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/421,916

(22) Filed: Mar. 16, 2012

(65) Prior Publication Data

US 2012/0218761 A1  Aug. 30, 2012

Related U.S. Application Data

(63) Continuation-in-part of application No. 12/423,567, filed on Apr. 14, 2009, now Pat. No. 8,210,697.

(60) Provisional application No. 61/045,070, filed on Apr. 15, 2008.

(51) Int. Cl.
*B60Q 1/12* (2006.01)
*G09F 13/22* (2006.01)
(Continued)

(52) U.S. Cl.
CPC ........... *G09F 13/22* (2013.01); *F21Y 2105/006* (2013.01); *F21Y 2105/008* (2013.01);
(Continued)

(58) Field of Classification Search
USPC .............. 362/84, 227, 235–238, 249, 249.02, 362/249.04, 249.06, 249.08, 249.09, 362/249.14, 249.16, 249.17, 249.18, 362/249.19, 806, 807, 811, 812; 40/410, 40/411, 427, 441, 442, 444, 552
See application file for complete search history.

(56) References Cited

U.S. PATENT DOCUMENTS 3,621,332 A * 11/1971 Janning .......................... 315/313
5,645,343 A *  7/1997 Rinehimer ..................... 362/235
(Continued)

FOREIGN PATENT DOCUMENTS

| DE | 10350913 | 6/2005 |
|----|----------|--------|
| DE | 10 2006 037 998 | 2/2008 |

(Continued)

OTHER PUBLICATIONS

EPO Search Report, EP 09733050, Sep. 7, 2012.
(Continued)

*Primary Examiner* — Hargobind S Sawhney
(74) *Attorney, Agent, or Firm* — Leveque Intellectual Property Law, P.C.

(57) ABSTRACT

A structure and method for three-dimensional lighting using light active technology. The structure has one or more sheets of light active material, with each sheet having lighting elements. The structure additionally has one or more folding elements along which the sheets of light active material are foldable to create a three-dimensional lighting structure having a center element located at a back side of the three-dimensional lighting structure. A power supply element can then be used to provide power to the lighting elements. A fastening element fastens together the sheets of light active material at fastening points to retain the three-dimensional lighting structure created by folding the one or more sheets of light active material. The three-dimensional lighting structure may be attached to a surface by attaching the center element directly to the surface or by attaching the center element to a substantially rigid backing that attaches to the surface.

35 Claims, 11 Drawing Sheets

(51) Int. Cl.

| | |
|---|---|
| *F21Y 105/00* | (2006.01) |
| *F21Y 111/00* | (2006.01) |
| *H01L 27/32* | (2006.01) |
| *F21V 19/00* | (2006.01) |
| *F21W 121/00* | (2006.01) |
| *F21Y 101/02* | (2006.01) |

(52) U.S. Cl.
CPC ....... *F21Y2111/001* (2013.01); *H01L 27/3202* (2013.01); *H01L 27/3237* (2013.01); *H01L 2251/5338* (2013.01); *H01L 2251/5361* (2013.01); *F21V 19/003* (2013.01); *F21W 2121/00* (2013.01); *F21W 2121/006* (2013.01); *F21Y 2101/02* (2013.01)
USPC ........................................ 362/84; 362/249.02

(56) References Cited

U.S. PATENT DOCUMENTS

| | | | |
|---|---|---|---|
| 5,747,940 A * | 5/1998 | Openiano .................. 315/185 S |
| 5,771,617 A * | 6/1998 | Baker ............................ 40/544 |
| 5,857,765 A * | 1/1999 | Deron ...................... 362/249.01 |
| 6,045,575 A | 4/2000 | Rosen et al. |
| 6,056,425 A * | 5/2000 | Appelberg .................. 362/493 |
| 6,382,814 B1 * | 5/2002 | Petrocelli ...................... 362/237 |
| 6,637,906 B2 * | 10/2003 | Knoerzer et al. .............. 362/84 |
| 6,639,355 B1 * | 10/2003 | Pennaz et al. ................. 313/498 |
| 6,688,759 B1 * | 2/2004 | Hadjimichael ............... 362/405 |
| 6,801,185 B2 | 10/2004 | Salley |
| 6,802,144 B2 * | 10/2004 | Szilagyi .......................... 40/615 |
| 6,811,563 B2 | 11/2004 | Savage et al. |
| 6,876,143 B2 * | 4/2005 | Daniels ........................ 313/504 |
| 6,962,737 B2 | 11/2005 | Volfson |
| 6,981,781 B2 * | 1/2006 | Tseng ...................... 362/249.16 |
| 6,998,772 B2 | 2/2006 | Terumoto |
| 7,256,427 B2 * | 8/2007 | Daniels ........................... 257/89 |
| 7,259,030 B2 * | 8/2007 | Daniels et al. .................. 438/22 |
| 7,294,961 B2 * | 11/2007 | Daniels et al. ................. 313/504 |
| 7,364,315 B2 | 4/2008 | Chien |
| 7,482,745 B2 * | 1/2009 | Shirogane et al. ............ 313/506 |
| 7,622,861 B2 | 11/2009 | Oooka et al. |
| 2004/0041800 A1 * | 3/2004 | Daniels .......................... 345/204 |
| 2004/0070195 A1 | 4/2004 | Nelson et al. |
| 2005/0082820 A1 * | 4/2005 | Nelson et al. ................... 283/83 |
| 2005/0188569 A1 * | 9/2005 | Derose ........................... 40/544 |
| 2005/0248935 A1 | 11/2005 | Strip et al. |
| 2008/0180949 A1 * | 7/2008 | Liao et al. ..................... 362/251 |

FOREIGN PATENT DOCUMENTS

| | | |
|---|---|---|
| DE | 20 2008 002 894 | 6/2008 |
| EP | 0458517 | 11/1991 |
| EP | 1367676 | 12/2003 |
| EP | 1367677 | 12/2003 |
| GB | 389110 | 3/1933 |
| GB | 2394109 | 4/2004 |
| JP | 08-203669 | 8/1996 |
| JP | 08-250279 | 9/1996 |
| JP | 2000197169 | 7/2000 |
| JP | 2005192648 A * | 7/2005 |
| JP | 2005-302387 | 10/2005 |
| TW | M315805 | 7/2007 |
| WO | WO 92/18964 | 10/1992 |
| WO | WO 03/023807 | 3/2003 |
| WO | WO 2005/036935 | 4/2005 |
| WO | WO2008005610 | 1/2008 |

OTHER PUBLICATIONS

EPO, Extended European Search Report, EP 13159344.4, Apr. 3, 2014.

* cited by examiner

100

200

300

800

900

1100

1200

1200

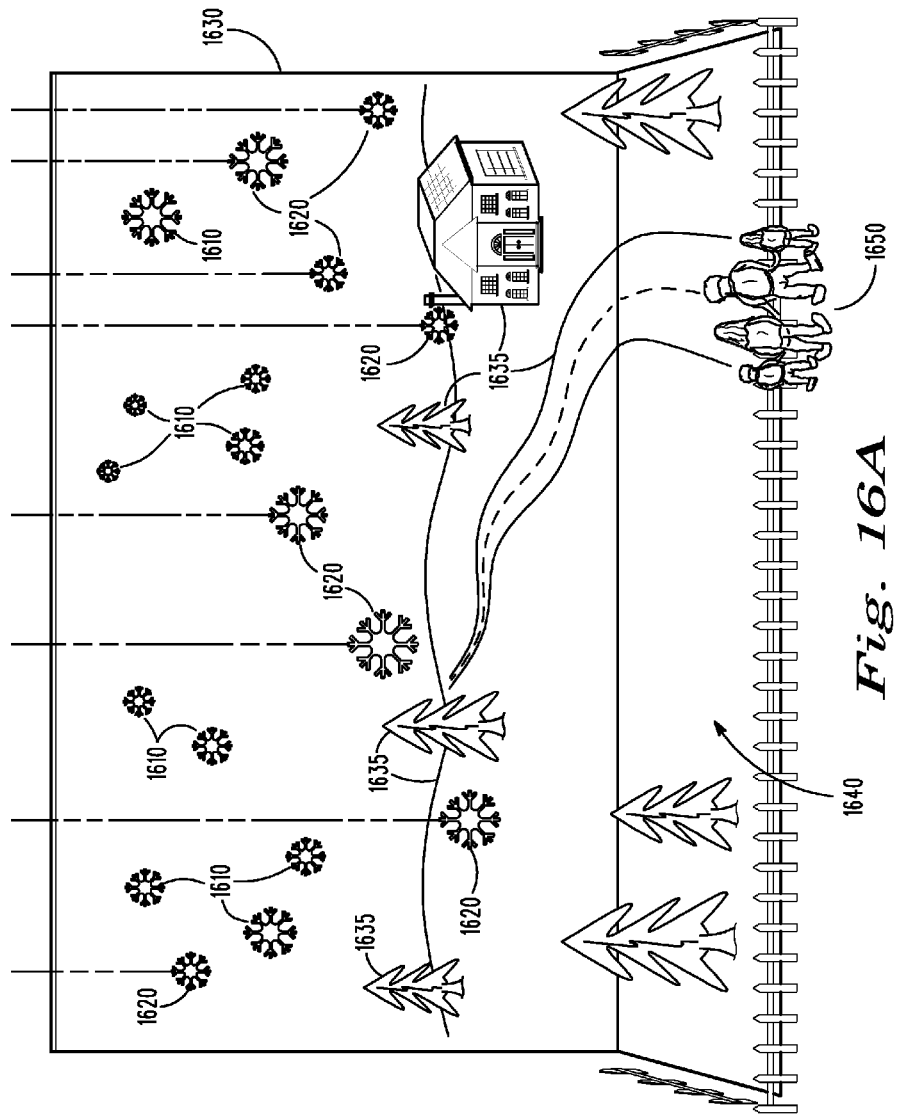

THREE-DIMENSIONAL LIGHTING STRUCTURE UTILIZING LIGHT ACTIVE TECHNOLOGY

PRIORITY CLAIM

This application claims priority to U.S. patent application Ser. No. 12/423,567 filed Apr. 14, 2009, which claims priority to U.S. Provisional Patent Application No. 61/045,070 filed Apr. 15, 2008, both of which are hereby incorporated by reference.

BACKGROUND

Existing lighting having miniature or light emitting diode (LED) technology employs rigid plastic frames to support two-dimensional shapes. These frames detract from the focus on the pattern and are bulky to store. Moreover, the frames used in current dimensional lighting are flat and therefore only support a two-dimensional ornament, thereby not providing a lighted three-dimensional user experience. This rigidity also denies flexibility in the number or quality of shapes that are available.

Existing miniature light technology furthermore has an operational life that is limited. Power load increases occur when one or more bulbs burn out and must be borne by the remaining lights until the entire circuit burns out at once, leaving a useless lighting fixture in which the problem bulb or bulbs are difficult to identify and replace. Additionally, such conventional lighting is notorious for using considerable power and generating considerable heat.

There therefore exists in the art a need for dimensional lighting that is three-dimensional, non-bulky, easy to store, flexible, and resilient to individual power outages.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

Figure 1:
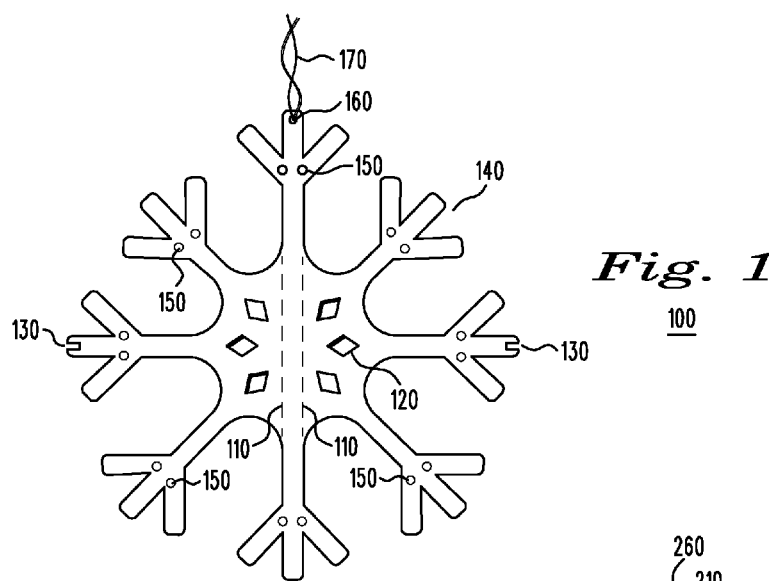
FIG. 1 is a front view of a three-dimensional lighting structure in accordance with certain embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with various embodiments, three-dimensional lighting structures, employing light active technology and arranged in one or more three-dimensional shapes, such as stars, balls, snowflakes, diamonds, and the like, which may or may not be geometrically patterned (geo-pattern), are disclosed. Such light active technology may be arranged in sheet or string format and includes organic light emitting diode (OLED) and inorganic light emitting diode (ILED) lighting technology. OLED technology employs organic compounds that are deposited, such as in rows and columns, as a film onto a flat carrier by a printing process. The resulting pixels of the organic compounds form an emissive electroluminescent layer that can emit light of varying colors. ILED technology uses inorganic materials.

The ease with which some light active technology may be folded, cut and shaped provides for lighting structures to be given a three-dimensional presentation in shape when used and then easily folded for ready storage in accordance with various embodiments. The durability of light active technology material provides for durable construction that can be used indoors or outdoors, and can be reused a number of times. The long lighting life associated with light active technology, such as OLED, is also attractive. Using this technology, the "support" framing that might otherwise be needed for decorative lighting can be minimized while still enjoying the longevity associated with light active technology.

The various embodiments described herein accord several advantages over non-three dimensional lighting. Other geo-dimensional lighting uses rigid plastic frames to support either miniature light strings or LED light strings, for example, in a flat, two-dimensional arrangement, and these frames detract from focus on the pattern and are bulky to store. The use of a rigid support structure does not provide for anything but a flat, two-dimensional lighting apparatus. This is quite different from the three-dimensionality of the lighting structure supported by the collapsible, non-rigid and non-bulky frame of the various embodiments described herein-a clear improvement in the art. Three-dimensional lighting, as opposed to a simply flat, two-dimensional, is achieved. The degree of three-dimensionality achieved is somewhat dependant on the number of sheets or plies of light active technology used or the intricacy of folding of one or more sheets of light active technology employed to render a three-dimensional form, which may be in a geometrical-pattern (geo-pattern) form though this is not required. As shown in the figures, and discussed below, the three-dimensional lighting may have multiple sheets of light active technology material that can be opened, or fanned open from closed, relatively flat closed storage, similar to the un-illuminated tissue paper balls, or it may be comprised of one sheet of light active technology material. For example, a three-dimensional structure may be achieved by fan folding a single sheet of active lighting material. As used herein, a sheet or ply of light active material refers to a single formed sheet that transmits light containing an emissive electroluminescent layer composed of a film of organic compounds (in the case of OLED) or a film of inorganic compounds (in the case of ILED). Thus, a sheet or ply of light active material is defined as a sheet or ply of light transmitting material. A sheet or ply of light active technology material may be comprised of lighting of only one color, or it may be comprised of various sections of varying colors; consider the red, white and blue colors of a flag, for instance, in a single sheet.

The three-dimensional decorative lighting disclosed herein does not have a structural frame and is collapsible into a flat shape for easy storage.

Light active technology, sometimes referred to herein as active lighting material, provides advantages in the embodiments herein. The use of active lighting characterized as being permanently embossed between sandwich layers and therefore virtually flat, means that there are no obtrusive bumps or encapsulated lights to interfere with the simplicity of the sheet or to be damaged by some sort of impact on the lighting structure itself. Moreover, there is a considerably longer light life associated with light active technology, vastly longer than that associated with regular LED lights and particularly current mini-lights often used in decorative lighting. Current decorative lighting suffers from increased power loading when individual bulbs in a strand burn out, i.e., the reduced resistance causes an increase in the wattage to the remaining lights. In time, the power load becomes so high that all of the remaining lights burn out at once. And, in the case of OLED, in which arrangement of each of the OLED light pixels is in parallel, power overload is mitigated.

The use of light active technology in multi-dimensional lighting allows for greater flexibility in selection and arrangement of shapes. Whereas conventional lighting uses fixed wiring that is generally limited to a small number, such as three to nine, homogeneous shapes, the three-dimensional decorative lighting has "power" strings of various lengths that are electrified in parallel and accordingly has multiple attachment points (sockets) so that the user can mix a virtually unlimited number of geo-shapes at his choosing and can skip sockets without having blank (unlit) sections.

Light active technology further provides considerable power savings, using considerably less power than current mini-lights and LED lights. It also produces significantly less heat than either of the conventional alternatives.

Three-dimensional dimensional lighting may be manufactured from plastic laminates having active lighting and is formed from one or more sheet plies of light active technology, such as by die pressing, die cutting, or other mechanical, heat, or light (e.g. laser) means, that are folded, secured or otherwise arranged into one or more three-dimensional arrangements to produce one or more desired three-dimensional shapes. The edges of the plies of the light active material can be sealed in order to protect, as necessary, the diode lighting and powering circuitry within. Sheet edges may be sealed by heat, light (e.g. laser), mechanical techniques, such as die-pressing, die-cutting under pressure, an adhesive, such as a silicon based bonding agent, that may be applied by a sealant gun after the edges are formed. Such treatment not only permits the three-dimensional lighting to be used in inclement weather but to also be directly subjected to submersion conditions if desired.

As shown in FIG. 1, a front view of an unopened three-dimensional lighting structure 100 is seen, in which only one sheet of light active material is visible. The shape is that of a snowflake as indicated by shaped portions 140 but many shapes may be used, as previously discussed. The three-dimensional shape has one or more folding elements, shown here as mid-line creases 110 (indicated by the dashed lines of FIG. 1), holes and/or perforations 120 to facilitate expansion from a flat (storage) shape to the three dimensional shape. The edges of the three-dimensional shapes in this embodiment will have slots 130 for the insertion of a fastening element (such as bead chain 210, for example, of FIG. 2) that will hold the light active sheets in the three dimensional shape; such slots are illustrated at the tips at either end of the horizontal axis of the three-dimensional structure. The sheets will vary in number depending on the degree of light production, size and three dimensionality desired. The sheets may be heat or laser welded, or otherwise formed along the ornament's folding elements, such as a midline, by these folding element retention elements to provide a hinge point. The light active sheets, in some applications, will be mechanically attached along the midline folding element by appropriate folding element retention elements such as stainless steel staples or glue. A hole 160, illustrated at the top of the three-dimensional lighting structure, is provided for hanging using wire, monofilament, hooks, etc. and may be reinforced if necessary by brass or other material. A power supply element, such as power cord 170, shown at the top of the ornament 100, provides electrical power to the discrete lighting elements of the light active technology material, whether they be OLEDs or ILEDs, for example. In FIG. 1, the discrete lighting elements of the light active technology material are denoted by reference number 150.

A three-dimensional decorative lighting may be fixed, variable or both. Fixed three-dimensional lighting has a fixed number of consistent three-dimensional shapes permanently attached to a power feed line, such as the power cords evidenced in FIGS. 1-5. Variable dimensional lighting will utilize separately selected shapes that are plugged into multiple power sockets of a "power string" (various lengths). For either type, self-adhesive type fasteners (such as Velcro®) may be used to suspend the power cord on surfaces. These fasteners facilitate the removal of the power cord when the three-dimensional lighting structure is un-installed.

The three-dimensional lighting structure's laminate materials may be clear, opaque or colored (totally or in selected spots) to provide variety. Various power, timer, programmable (such as phased/sequenced), remote switch, etc. illumination arrangements may be optionally employed as desired. Such arrangements may be remotely controlled by programmable means, such as firmware, controller, and computer. The power supply element(s) described herein may be provided with power by any number of power sources, including, but not limited to, DC power, AC power, battery power, solar power, low voltage transformer, back-up supplies, or any combination thereof.

Figure 2:
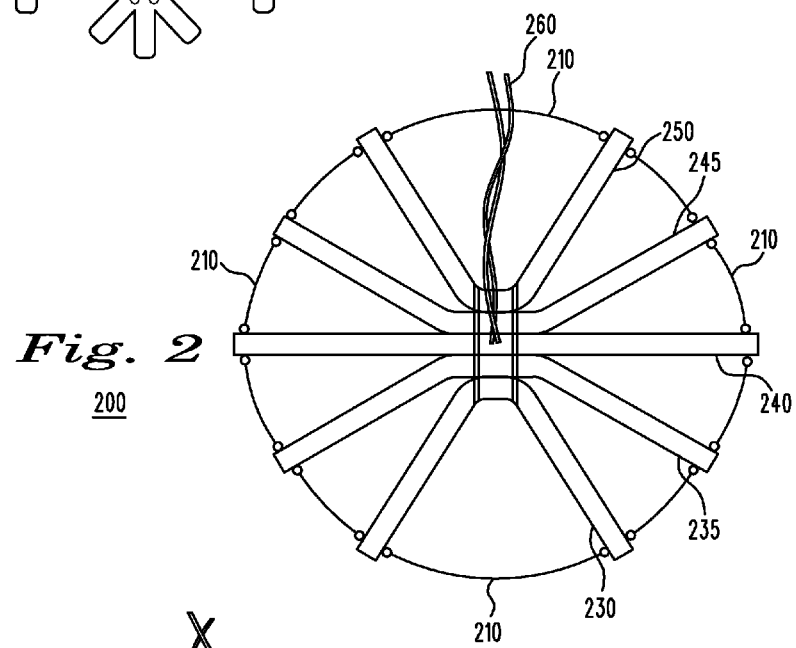
FIG. 2 is a top view of a three-dimensional lighting structure assembly in accordance with certain embodiments.

FIG. 2 is a top view of a three-dimensional lighting structure 200 in accordance with certain embodiments. In this view, an opened, fully three-dimensional ornament has folding mechanisms or elements 220, such as creases, slots, perforations at the appropriate point of the sheets of light active material 230, 235, 240, 245, 250 and employs a shape maintainer, referred to as a fastening element, such as a molded beaded "chain" 210, around the peripheral of the three-dimensional structure. The flexibility of sheets 230, 235, 245, 250 can be easily seen and contribute greatly to the pliability and three-dimensional nature of the three-dimensional ornament; while sheet 240 is substantially planar and may also be substantially rigid to lend structural support to the three-dimensional lighting structure, other sheets are easily shaped to the desired ornament shape. The sheets 230, 235, 240, 245, 250 may be affixed to each other by means of a folding element retention element such as by using a heat seal or weather-resistant fasteners, such as made of brass or stainless steel, for example. While the use of folding mechanisms/elements is apparent along the mid-line of the plies in this figure, this is by way of example only and not limitation. For example, other three-dimensional shapes, such as a box-kite arrangement may utilize folds/creases other than along the mid-line of its plies of light active material. Power cord 260 is used to provide power to the plies of light active material.

Figure 3:
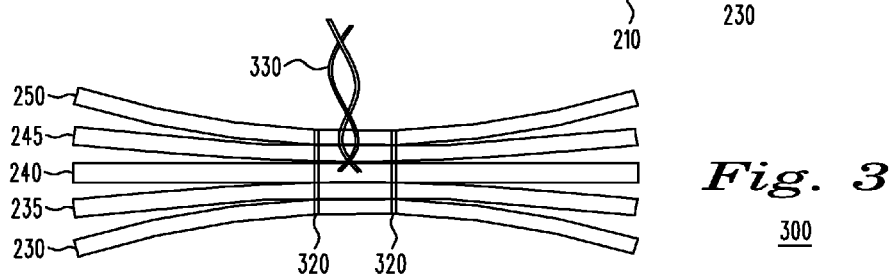
FIG. 3 illustrates storage of a three-dimensional lighting structure in accordance with certain embodiments.

FIG. 3 illustrates storage of a three-dimensional lighting structure 300 in accordance with certain embodiments. This top view of structure 300 shows that the structure may be collapsed (after removal of the beaded "chain" shape maintainer/fastening element of FIG. 2, for example) and sandwiched down into a smaller version for storage, due to the use of flexible active lighting and the corresponding absence of a rigid frame structure. The folding element creases 320, perforations at the center of the structure, are the locations at which folding of the sheets 230, 235, 245, 250 occurs, and are still visible, as indicated by the parallel, vertical lines shown in the center. Power cord 330 is used to provide power to the plies of light active material.

Figure 4:
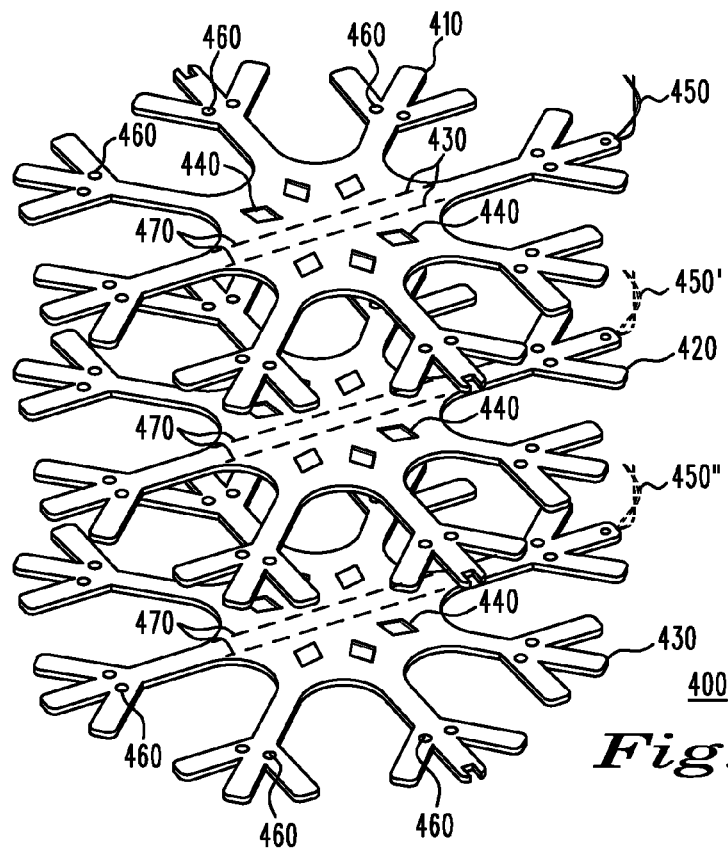
FIG. 4 is an exploded view of a three-dimensional lighting structure in accordance with certain embodiments.

FIG. 4 is an exploded view of a three-dimensional lighting structure 400 in accordance with certain embodiments. This view illustrates what an exemplary three-dimensional lighting structure might look like and is presented as an aesthetically pleasing snowflake shape. It can be seen that the folding elements 470, shown as center folding creases, or slotting, perforations, etc. in the middle of the design are evident, as are the perforated patterns 440 repeated in each sheet 410, 420, 430 of the three-dimensional lighting structure. While the perforations 440 in this example are shown as diamond shaped, any size or shape may be utilized and may have a positive impact on three-dimensional lighting structure performance. For example, as the size of the perforations increases, the amount of wind resistance offered by the three-dimensional lighting structure lessens.

The power cord 450 is clearly shown going to each layer or sheet of light active material 410, 420, 430, as are the dashed representations of same 450', 450" for the bottom two layers indicates that they may either be powered separately or together with the top layer. Either way, when power is provided to the light active material of the sheets via power cord 450, the lighting of every layer is powered. Power cord 450 (450', 450") provides electrical power to the discrete lighting elements of the light active technology material, whether they be OLEDs or ILEDs, for example. The discrete lighting elements of the light active technology material are denoted by reference number 460.

Figure 5:
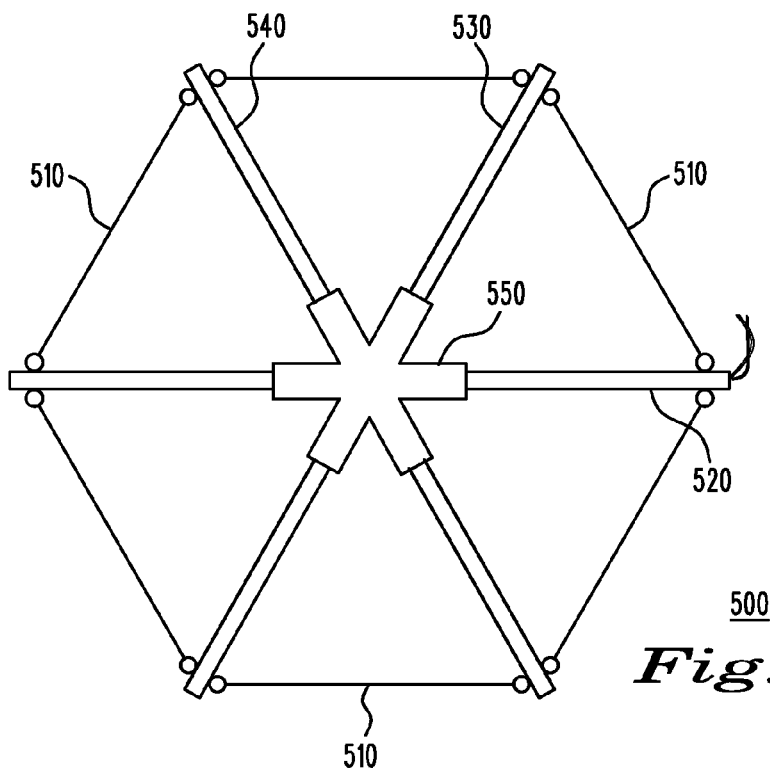
FIG. 5 is a bottom view of a three-dimensional lighting structure in accordance with certain embodiments.

FIG. 5 is a bottom view of a three-dimensional lighting structure 500 in accordance with certain embodiments. In this view, a chain shape maintainer or fastening element 510 around the periphery of the three-dimensional lighting structure to hold the three sheets of light active material 520, 530, 540 open in position is evident. At the center, the use of an optional end clip 550, a fastening element useful for maintaining the desired three-dimensional shape of the three-dimensional lighting structure while open, is shown. It is noted here that only three sheets of light active material 520, 530, 540 are shown, but any number of sheets may be used within the spirit and scope of the invention. Fastening element 550 may be made of plastic or other substantially rigid material. As a shape retainer, end clip 550 accepts the ends of sheets 520, 530, 540 as shown into grooves into which the sheets may snugly fit.

Figure 6:
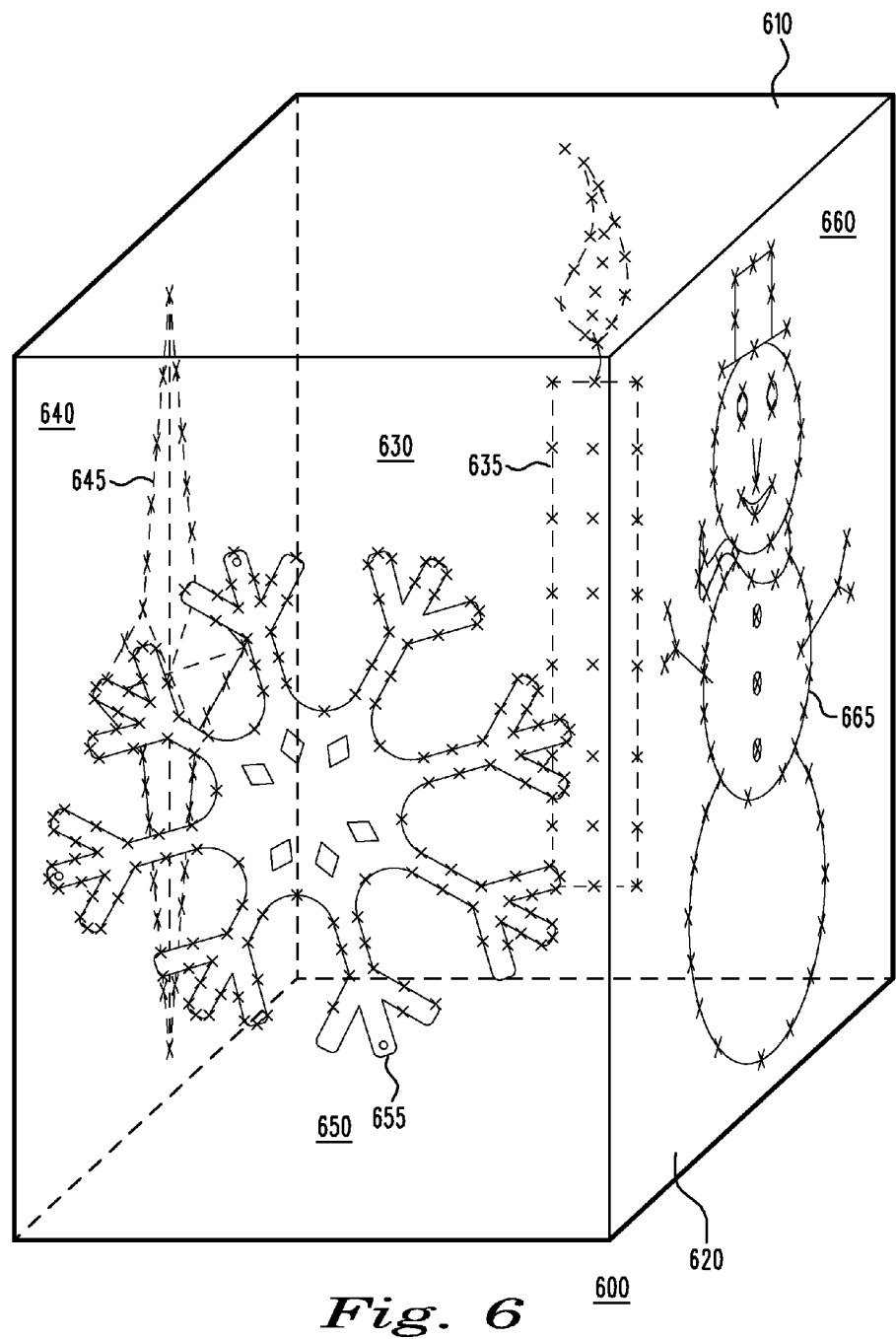
FIG. 6 is a rectangular three-dimension lighting structure in accordance with certain embodiments.

Referring now to FIG. 6, an exemplary rectangular shaped three-dimensional lighting structure 600 is illustrated, in accordance with various embodiments. This ornament 600 has six sides: a top 610, a bottom 620, a back side 630 in which a candle-shaped lighting figure is shown, a left side 640 in which a star-shaped lighting FIG. 645 is shown, a front side 650 with a snowflake-shaped lighting FIG. 655, and a right side 660 in which a snowman-shaped FIG. 665 is shown. It can be seen that each of the four sides with patterned lighting, each has its own arrangement of lights within the side to create a unique design, whether it be a snowman, a snowflake, a star or a candle. The "x" symbols on the drawing indicate the presence of the lighting elements within the sheet(s)/ply(s) of active lighting material for a particular side of the ornament. The placement of the lighting elements to create the lighting image of a desired shape of each of the four sides may occur by appropriate placement of the lighting elements during manufacture, such as by proper placement of the elements by means of "pick and place" manufacturing or the like. And, while the shapes may be made by using the lighting elements to simply outline the desired shape, it can be seen by reference to the candle shape 635, for example, that lighting elements may be used to fill in a design as well; the lighting elements within a design may be evenly spaced or not. Moreover, the desired decorative shape may be formed by some combination of lighting and shading, such as by placement of lighting elements on a field of colored material. In this manner, the lighting may be used to simply enhance the effect of a colored or shaded portion of the active lighting material. The lighting elements employed in the three-dimensional lighting structure may themselves be of varying colors. As examples of the above, consider a painted angle may be accentuated by the placement of a halo formed by lighting elements, one or more candles enhanced by placement of lighting elements to represent candle flames, and a holiday tree with lighting elements strategically placed to yield the desired effect.

Figure 7:
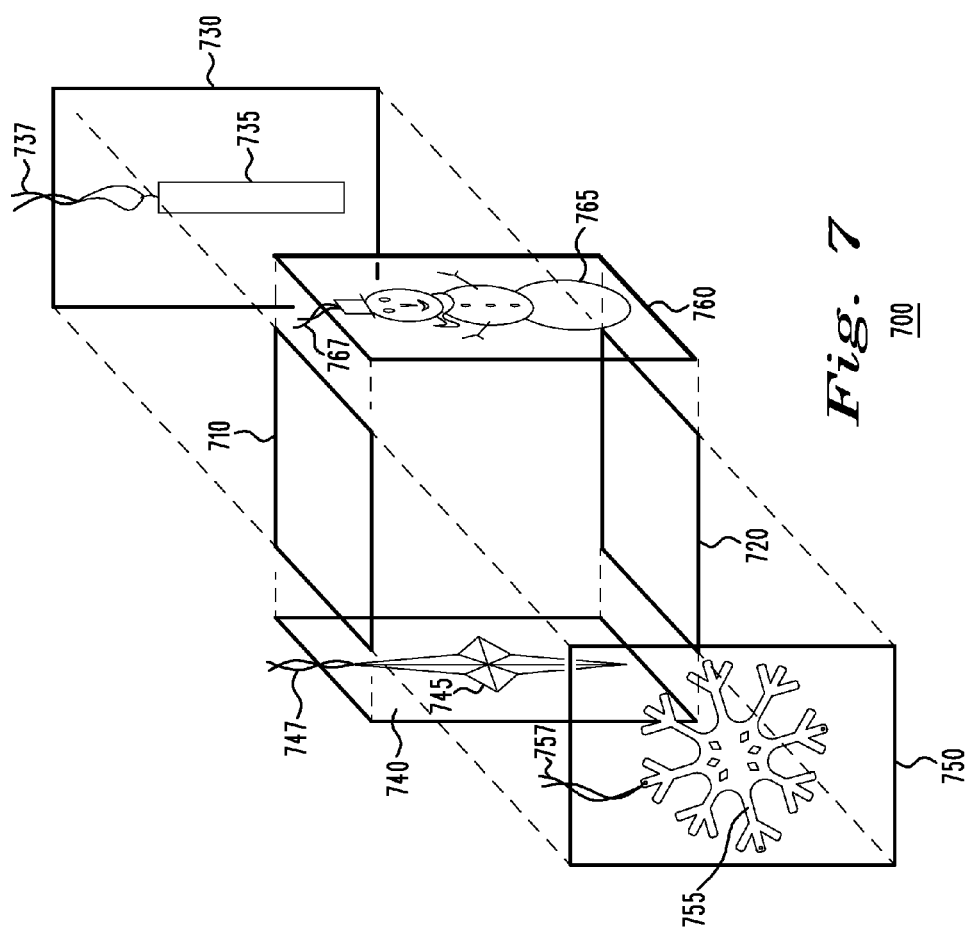
FIG. 7 is a rectangular three-dimension lighting structure comprised of multiple sheets of light active material in accordance with certain embodiments.
Figure 8:
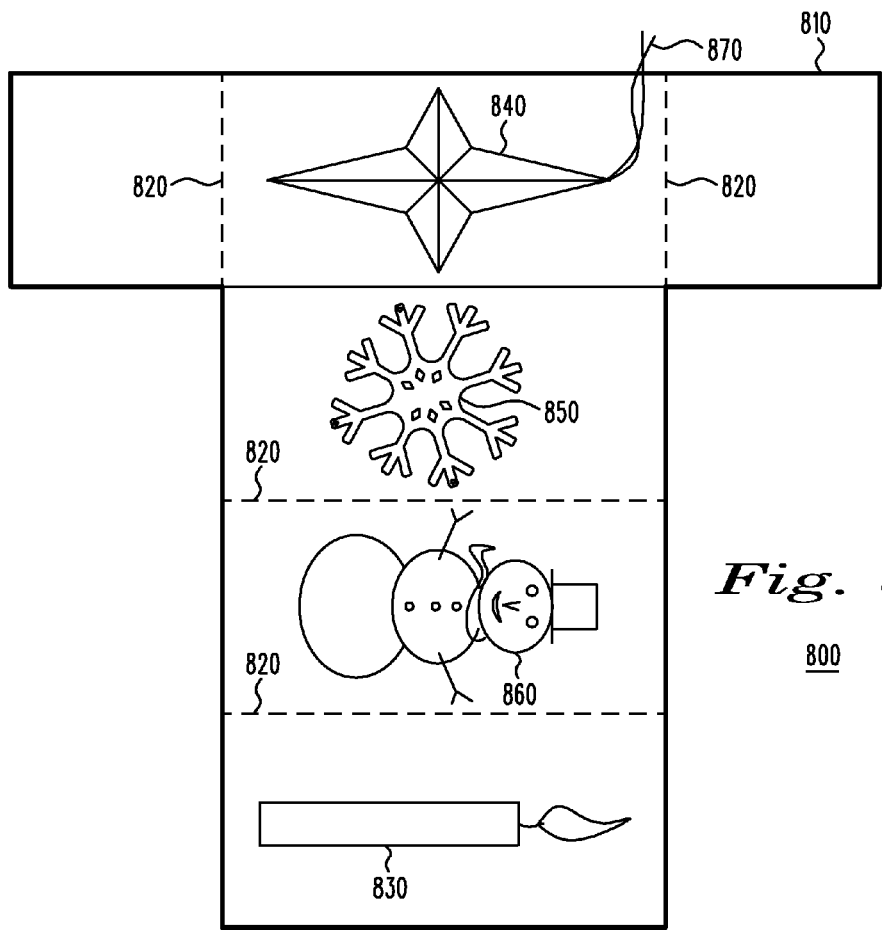
FIG. 8 is a rectangular three-dimension lighting structure comprised of a single sheet of light active material in accordance with certain embodiments.

Any given three-dimensional lighting structure may theoretically be comprised of one sheet or ply of light active material, as illustrated in FIG. 8, or multiple sheets of material, as shown in FIGS. 2, 3, 4, 5 and 7, for example. When a single sheet of light active material is used, folding of the sheet at one or more folding elements to create a three-dimensional surface together with a fastening element to hold the three-dimensional shaping into place defines a three-dimensional lighting structure.

Referring now to FIG. 7, it can be seen that the rectangular three-dimensional lighting structure 700 is comprised of six different sheets/plies of active lighting material: top 710; bottom 720; back side 730 having a candle-shaped FIG. 735 comprised of lighting elements powered by power cord 737; left side 740 having a star-shaped FIG. 745 comprised of lighting elements powered by power cord 747; front side 750 having a snowflake-shaped FIG. 755 comprised of lighting elements powered by power cord 757; and a right side 760 having a snowman-shaped FIG. 765 comprised of lighting elements powered by power cord 767. It can be seen that each separate sheet of light active material has its own power cord to power lighting elements within that particular sheet. The sheets of light active material are smaller but more power cords must be dealt with.

Conversely to FIG. 7 in which a three-dimensional lighting structure is formed from multiple sheets of material, FIG. 8 illustrates that a similarly shaped ornament may be formed from one sheet/ply of light active material. Ornament 800 is formed from a single sheet/ply 810 of light active material having various sections that when folded along folding elements 820 form a six-sided rectangular shaped, three-dimensional lighting structure with shapes 830, 840, 850, 860 as shown in FIG. 6. A particular advantage of the unitary ornament 800 is that only a single power cord is needed to power all lighting elements within the single sheet 810. It is noted that any number of sheets of light active material may be utilized to create the three-dimensional lighting structure. Thus, while FIG. 7 illustrates multiple sheets and FIG. 8 illustrates one sheet, it is understand that any number of sheets, including up to a theoretically infinite number of sheets may be employed so long as the result is a three-dimensional light active structure that retains its three-dimensional nature by means of a fastening element.

Figure 9:
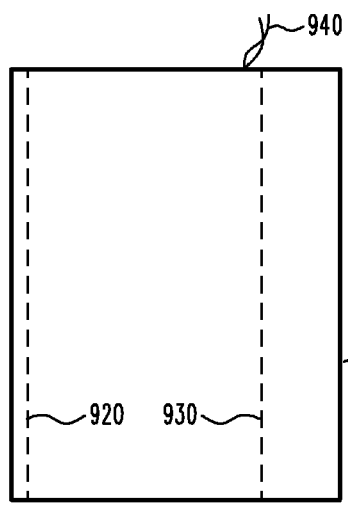
FIG. 9 is a sheet of light active material having non-centered folding elements in accordance with certain embodiments.

As previously mentioned, folding elements, such as bends, creases, perforated portions, etc. may be along the center or midline of a sheet of light active material. Top view 900 of FIG. 9 illustrates that this limitation is not a requirement of the various embodiments. Ply/sheet of light active material 910 has two folding elements, 920 and 930, both of which are off-center, not mid-line, with respect to sheet 910. It is noted that such folding elements 920 and 930 are particularly useful in the creation of non-symmetrical three-dimensional lighting structure shapes. Examples of non-symmetrical three-dimensional ornaments might include animal shapes, nature shapes (flowers, trees), etc.

Figure 10:
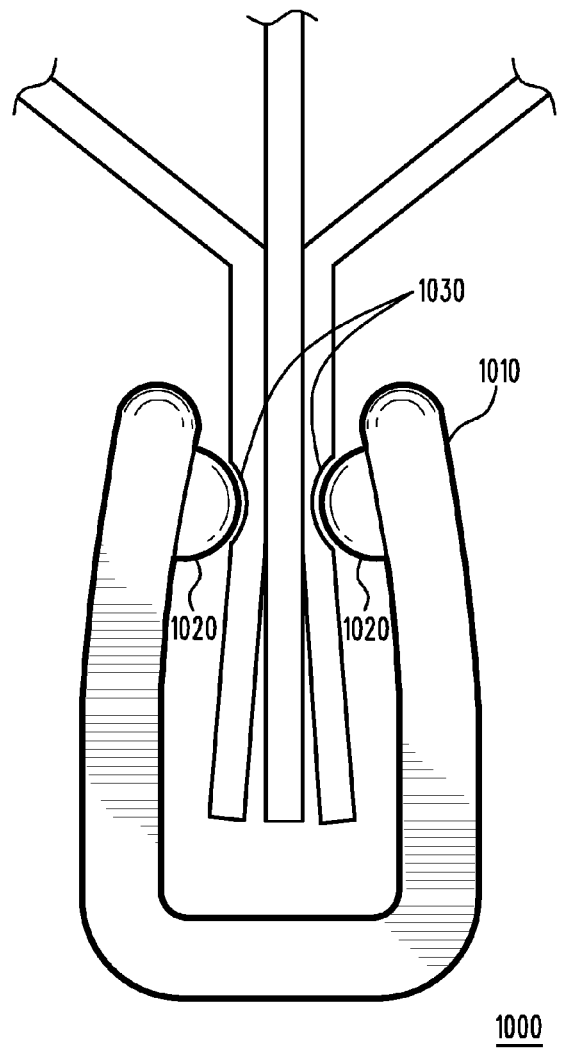
FIG. 10 is a clip assembly fastening element in accordance with certain embodiments.

While it is envisioned that a fastening element may be used to fasten together two or more sheets of light active material, it may also be used to fasten a single sheet or ply of material to itself, at appropriate fastening points to help retain three-dimensional shapes created by shaping the one or more sheets of light active material. Such might be the case, for example, where a three-dimensional shape is created from a single sheet or from a small number of sheets which are, at various locations, are self-attached or fastened. For example, consider that the petals of a flower are made from a single sheet and feature the appearance of separate, wavy petals by self-attaching the material at the start of a new petal, much like the art of origami. The folds to be affixed are folded edges of the same sheet/ply of material. The fastening element may be made of weather-resistant material, such as plastic, brass or stainless steel. And, as previously mentioned, the fastening element for fastening two or more plies/sheets of material may also be affixed to each other using a heat seal or weather-resistant fasteners, such as made of plastic, brass or stainless steel, for example; FIG. 10 illustrates a clip that may be used for this purpose. Velcro or glue may be used as a fastening element, in addition to the clips of FIGS. 5 and 10, and the beaded chain of FIGS. 2 and 5. And, FIG. 5 provides an illustration that one or more fastening elements may be used in combination; that drawing illustrates the use of a beaded chain together with an end clip.

Referring now to FIG. 10, an exemplary clip serves as a fastening element for fastening together the light active material is shown. Clip element 1000 is comprised of a unitary body portion 1010, formed as a substantially u-shaped body. Proximate either lateral end of the body portion 1010, substantially round projections, herein referred to as dimplets 1020, are formed along the inside surface of body portion 1010 and may be integral unitary body portion 1010; conversely, they may be separately formed by affixed to the inside surface of body portion 1010 as shown. Clip element 1000 fits snugly over the ends of two or more surfaces/edges of light active material and the dimplets 1010 are designed to match up with corresponding depressions 1030 found within the surface of the light active material sheet being fastened together. Here, there are three sheets/folded edges of light active material being fastened together in which the two outer sheets/folded edges of material have the depressions suitable for receiving the dimplets 1020 when clip assembly 1000 is forced over the three sheets/folded edges of material.

It is further understood that fastening elements serve to retain the three-dimensional shape of the lighting structure formed by folding/bending one or more sheets of light active material. For example, it is further envisioned that a fastening element, in addition to the clips, beaded chain and self-adhesive means discussed above, can be provided by a tab portion that can be mated with a slot portion upon folding the sheet(s) along the one or more folding element lines. The tab portion in an exemplary embodiment may be formed along an edge of one sheet of light active material. The slot portion may be formed elsewhere in the same sheet or in another sheet, but is operable to receive the tab portion when the one sheet is folded along the one or more folding elements to mate the tab portion to the slot portion. Once the tab and slot portions are mated, other fastening elements, described above, can be optionally used to strengthen the fastening/retaining function of the fastening element. Moreover, any number of slots and corresponding tabs may be used as desired.

Consider again, for example, FIGS. 8 and 9. In FIG. 8, formed of one sheet of light active material, either or both of the portions that will serve as top and bottom surfaces when the sheet is followed along folding elements 820 may operate as tab portions that may be inserted into a mating edge portion of the sheet that serves a slot function. This may be further enhanced by extending the length of the tab portion(s) to be retained within a slot edge to which it is mated. Once the tab(s) and slot(s) portions are mated, they may be further retained in place by the application of one or more additional fastening elements, such as tape, glue or velcro, that serve to bolster the retention function.

Furthermore, it may be considered that folding elements, such as perforations along which a sheet(s) may be folded may additionally serve a slot function. Consider that the dashed line that represents folding line 920 in FIG. 9 could be representative of one or more slot portions that function to receive one or more tab portions that may be mated to them by the folding process. Of course, folding the sheet along folding line 920 also may be considered to form a tab portion. And, the use of two such sheets of material as sheet 910 in this manner would demonstrate corresponding tab and slot portions.

In accordance with further example implementations, it is desired to provide increased visual impact to three-dimensional lighting structures that employ active light technology. This may be accomplished by attaching or affixing a center element of the three dimensional lighting structure to a substantially rigid backing, which, in turn may be attached or affixed to a surface, such as an outside wall, indoor wall, or the like. The center element may be one of the sheets or a portion of one of the sheets of light active material at the geometrically considered center of the design and shape of the three-dimensional lighting structure, in the case where the three-dimensional lighting structure is formed of multiple sheets of light active material. Or, the center element may be considered to be a portion of a sheet of light active material at the geometrical center of the design and shape of the three-dimensional lighting structure, in the case where the three-dimensional lighting structure is formed of a single sheet of light active material. The geometric center of a three-dimensional lighting structure may be that location or part of the three-dimensional lighting structure that may be considered to be the "back" of the lighting structure and so may be attached to the substantially rigid backing without detracting or taking away from the aesthetic of the structure. As shown herein, it may generally be the backside of the structure, though different locations may be used for different sized and shaped three-dimensional lighting structures. The substantially rigid backing may in some implementations be a sheet of light active material possessing enough rigidity to support attachment of the three-dimensional light structure to it; in this case, the sheet of light active material that serves as substantially rigid backing for the three-dimensional lighting structure is not non-rigid, flexible and foldable as are other sheets of light active material in the structure. These improvements can be used to increase the three-dimensional effect of the environment in which the three-dimensional lighting is used. Moreover, this provides a less costly approach, as fewer of the active lighting sheets need to be used.

The substantially rigid backing provides a sturdy backing for mounting the three-dimensional lighting structure to a surface, like an exterior or internal wall, partition, or divider that may be solid, such as drywall, siding, brick and stucco, or with openings, such as slatted fencing, lattice work, and grid-patterned. The backing material may have holes which may be reinforced with grommets to allow for the attachment of the three-dimensional lighting structure by single nails, hooks, screws or by mounting with multiple nails, hooks and screws. The substantially rigid backing may be made of commercially available solid plastic, corrugated plastic or other material, so long as the backing is rigid enough to support the three-dimensional lighting structure attached to it. For example, the backing may be a PVC rigid vinyl sheet, characterized as being resistant to water, chemicals and tearing, as well as having excellent printability, or a PVC plastic sheet that may be transparent, nearly invisible, abrasion resistant, and UV (ultraviolet) resistant. Further, corrugated plastic or corriboard, known under various tradenames, including Coroplast, IntePro, Correx, Twinplast, Twinwall, Corriflute or Corflute, for example, has a composition similar to that of corrugated fiberboard and may include extruded twinwall plastic sheets from high-impact polypropylene resin and are capable of standing up to adverse weather conditions and/or harsh chemicals. The substantially rigid backing may be UV resistant, and may be clear, opaque or colored. The center element of the three-dimensional lighting structure may be affixed to the backing material by using a variety of materials and techniques, such as Velcro, laminate staples, laser or heat sealing or welding, adhesive, etc.

Figure 11:
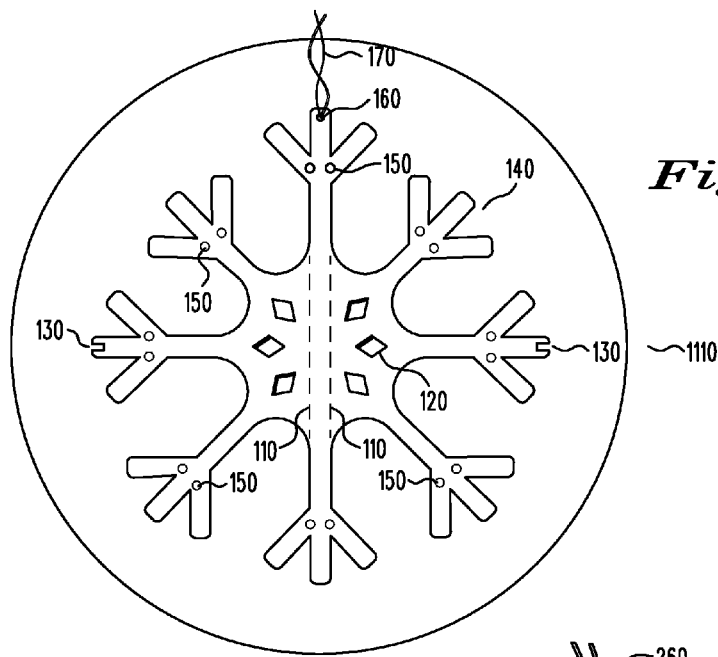
FIG. 11 is a front view of a three-dimensional lighting structure attached to a substantially rigid backing in accordance with certain embodiments.
Figure 12A:
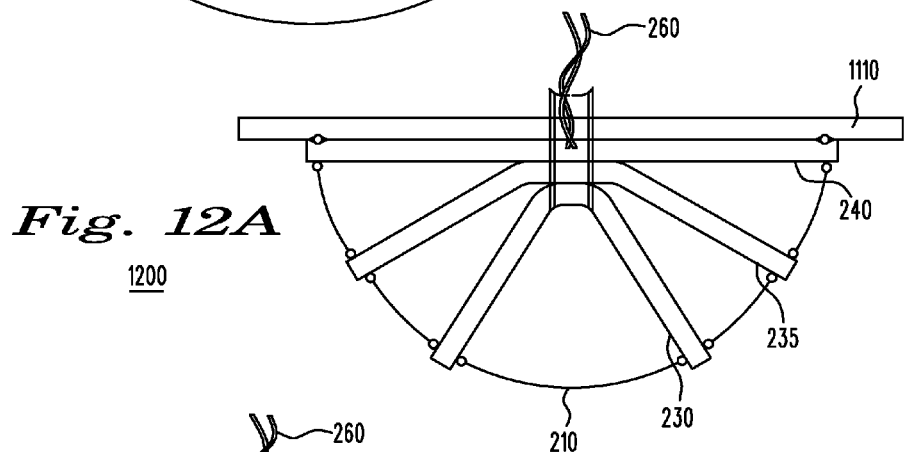
FIG. 12A is a top view of a three-dimensional lighting structure assembly light active material attached to a substantially rigid backing, in accordance with certain embodiments.

Referring now to FIG. 11, a front view of a three-dimensional lighting structure 1100 in accordance with certain embodiments is shown. The single sheet of light active material shown serves as the center element of the three-dimensional lighting structure and is attached to substantially rigid backing 1110. This can also be observed in the top or cross-sectional view of lighting structure 1200 in FIGS. 12A and 12B. In FIG. 12A, light active sheet 240 serves as the center element of the three-dimensional lighting structure 1200 and is shown attached to substantially rigid backing 1110. In this implementation, it can be seen that bead chain 210 extends through sheet 240 and serves to retain the three-dimensional shape of the lighting structure, as previously discussed. Substantially rigid backing 1110 may attach to a wall, partition, divider or other suitable surface, which may be substantially flat. In the alternate implementation of FIG. 12B, it can be seen that the center element also can serve as the substantially rigid backing, thereby eliminating the need for a separate backing element. To be suitably rigid, sheet 240' is thicker than in the embodiment of FIG. 12A. In this example, the substantially rigid backing is a sheet of light active material 240' possessing enough rigidity to support attachment of the three-dimensional light structure to it; sheet of light active material 240' serves as substantially rigid backing for the three-dimensional lighting structure and is not non-rigid, flexible and foldable as are other sheets of light active material in the structure that are coupled to it.

It is noted that while substantially rigid backing 1110 is shown as circular or oval, it is intended that any shape of backing may be used, including square, rectangular, diamond or patterned shapes. Additionally, backing 1110 may be the approximate size, shape and pattern of the center element attached to it.

Figure 13:
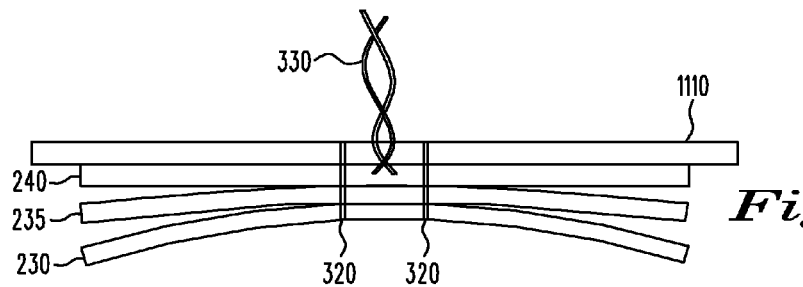
FIG. 13 illustrates storage of a three-dimensional lighting structure attached to a substantially rigid backing, in accordance with certain embodiments.
Figure 14:
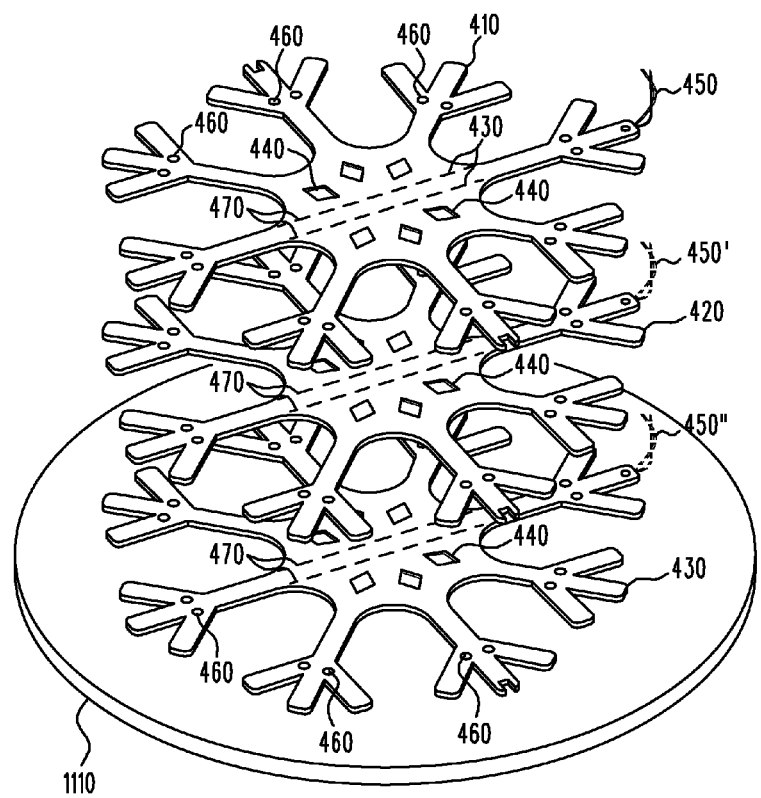
FIG. 14 is an exploded view of a three-dimensional lighting structure of light active material attached to a substantially rigid backing, in accordance with certain embodiments.

In FIG. 13, a view of a collapsed lighting structure 1300 formed of three sheets of light active material is provided. Sheet 240 serves as the center element of the three-dimensional lighting structure and is shown affixed to backing 1110. In the exploded view of three-dimensional lighting structure 1400 of FIG. 14, the third and bottom sheet 430 serves as the center element and is attached to backing 1110 as indicated.

These views illustrate exemplary three-dimensional lighting structures with the center element attached to a substantially rigid backing 1110. The aesthetically pleasing snowflake shape shown is attached to backing 1110 which may be used to attach the lighting structure to a surface. It can be seen that the folding elements 470, shown as center folding creases, or slotting, perforations, etc. in the middle of the design are evident, as are the perforated patterns 440 repeated in each sheet 410, 420, 430 of the three-dimensional lighting structure. While the perforations 440 in this example are shown as diamond shaped, any size or shape may be utilized and may have a positive impact on three-dimensional lighting structure performance. For example, as the size of the perforations increases, the amount of wind resistance offered by the three-dimensional lighting structure lessens.

The power cord 450 may be used to power each layer or sheet of light active material; power cords 450', 450" may also be used to power the bottom two light active layers. Either way, when power is provided to the light active material of the light active sheets, the lighting of every layer may be powered. Power cord 450 (450', 450") provides electrical power to the discrete lighting elements of the individual sheets of light active technology material, whether they be OLEDs or ILEDs, for example. The discrete lighting elements of the light active technology material are denoted by reference number 460.

Figure 15:
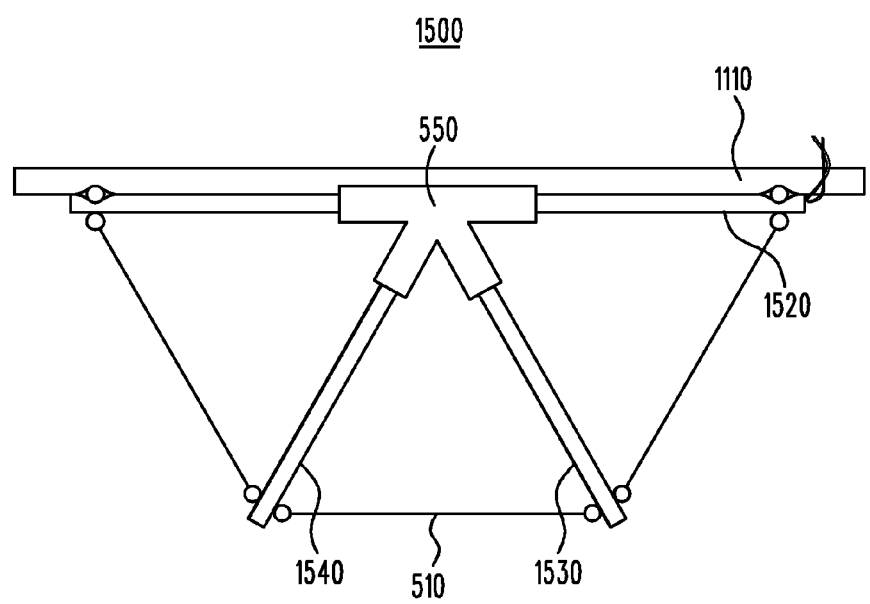
FIGS. 15 and 16 present front and top views of an artistic scene employing three-dimensional lighting structures, in accordance with certain embodiments.

FIG. 15 illustrates a bottom view of three-dimensional lighting structures 1500 formed of sheets of light active material, in accordance with certain implementations and embodiments. Chain shape maintainer or fastening element 510 around the periphery of the three-dimensional lighting structure hold the three sheets of light active material 1520, 1530, 1540 open in the three-dimensional structure formed. Sheet 1520 serves as the center element of the three-dimensional structure and is affixed or attached to backing 1110 as shown. At the center, the use of an optional end clip 550, a fastening element useful for maintaining the desired three-dimensional shape of the three-dimensional lighting structure while open, is shown. It is noted here that only three sheets of light active material are shown, but any number of light active sheets may be used within the spirit and scope of the invention. Fastening element 550 may be made of plastic or other substantially rigid material. As a shape retainer, end clip 550 accepts the ends of sheets 1520, 1530, 1540 as shown into grooves into which the sheets may snugly fit.

Figure 12B:
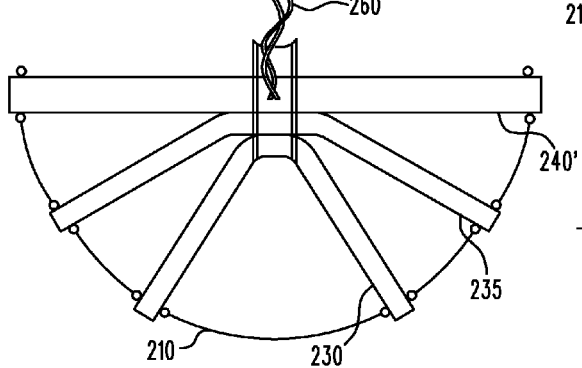
FIG. 12B is a top view of a three-dimensional lighting structure assembly light active material having a sheet of light active material that is substantially rigid that serves as a substantially rigid backing, in accordance with certain embodiments.

It can be seen from the above that attaching a center element of the three-dimensional lighting structure to a substantially rigid backing can eliminate approximately half of the layers of light active material, in the examples shown in which a spherical shape, for instance, if cut in half; reference can be made to FIGS. 12A and 12B which are roughly half the size as the three-dimensional structure in FIG. 2 and similarly FIG. 13 is roughly half the size as the three-dimensional structure in FIG. 3. Of course, the difference in the number of sheets used in the three-dimensional structure with backing may vary greatly depending upon the size, shape and configuration of the lighting structure.

Figure 16B:
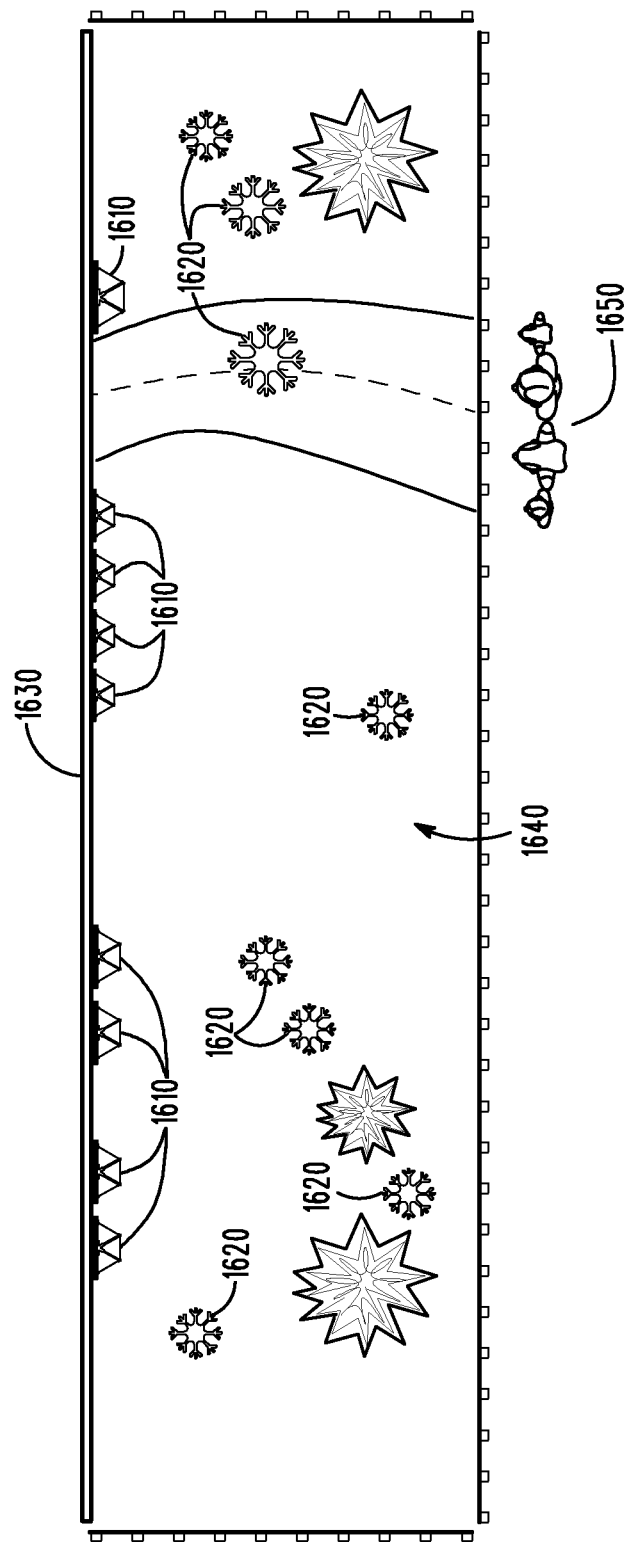

Referring now to FIGS. 16A and 16B, an implementation in accordance with various embodiments is shown. The scene created is a visually interesting winter scape in which three-dimensional structures, in this example snowflakes 1610 attached to flat wall 1630 are used in combination with other decorative elements, such as hanging three-dimensional light active lighting structures 1620, elements 1635 painted on flat wall 1630, and a foreground area 1640 with its own three-dimensional elements, such as free hanging or pole mounted three-dimensional lighting, are used to great effect. The use of varying sizes and depths increases the three-dimensional effect of the overall scene, especially where a focus to a distant point is desired, i.e. parallax effect. Such a decorative scene would be especially effective in store and similar displays.

From the foregoing, it can be seen that consistent with certain implementations, a three-dimensional lighting structure may have one or more one non-rigid, flexible, foldable double-faced sheets of light active material, with each sheet of light active material having a plurality of lighting elements that are sandwiched between two or more laminate layers and that comprise emissive electroluminescent material and having circuitry coupled to the light elements within; at least one folding element of the at least one sheet of light active material, with a collapsible three-dimensional lighting structure formed of the at least one sheet of light active material and the at least one folding element; a power supply element to provide power to the circuitry coupled to the lighting elements of the at least one sheet of light active material; a fastening element coupled to the at least one sheet of light active material at at least one fastening point, the collapsible three-dimensional lighting structure removably retained in a three-dimensional form by the fastening element; and a center element of the three-dimensional lighting structure to which the at least one sheet of light active material and fastening element are coupled and located at a back side of the three-dimensional lighting structure.

Also, consistent with certain implementations, a three-dimensional lighting structure may be created by: folding at least one non-rigid, flexible, foldable sheet of light active material along at least one folding element to create a collapsible three-dimensional lighting structure having a center element located at a back side of the three-dimensional lighting structure, with each sheet of light active material having lighting elements that are sandwiched between two or more laminate layers and that comprise emissive electroluminescent material and having circuitry coupled to the light elements; and removably retaining the three-dimensional lighting structure by activating a fastening element to retain the three-dimensional lighting structure created by folding the at least one sheet of light active material along the at least one folding element.

A method of manufacture of a three-dimensional lighting structure includes: providing at least one non-rigid, flexible, foldable sheet of light active material, with each sheet of light active material having lighting elements that are sandwiched between two or more laminate layers and that have emissive electroluminescent material and having circuitry coupled to the plurality of light elements; providing the at least one non-rigid, flexible, foldable sheet of light active material with at least one folding element along which the at least one non-rigid, flexible, foldable sheet of light active material are foldable to create the three-dimensional lighting structure having a center element located at a back side of the three-dimensional lighting structure; and providing a fastening element to removably retain a collapsible three-dimensional lighting structure created when the at least one sheet of light active material are folded along the at least one folding element.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A three-dimensional lighting structure, comprising:
   at least one non-rigid, flexible, foldable sheet of light active material, with each sheet of light active material being a sheet of light transmitting material having a plurality of lighting elements that are sandwiched between two or more laminate layers of the each sheet of light active material and that comprise emissive electroluminescent material and having circuitry coupled to the plurality of light elements within;
   at least one folding element of the at least one sheet of light active material, with a collapsible three-dimensional lighting structure formed of the at least one sheet of light active material and the at least one folding element;
   a power supply element to provide power to the circuitry coupled to the plurality of lighting elements of the at least one sheet of light active material;
   a fastening element coupled to the at least one sheet of light active material at at least one fastening point of the at least one sheet of light active material, wherein the collapsible three-dimensional lighting structure is removably retained in a three-dimensional form by the fastening element; and
   a center element that is a portion of the at least one non-rigid, flexible, foldable sheet of light active material located and coupled at a back side of the three-dimensional lighting structure.

2. The lighting structure of claim 1, wherein the at least one sheet of light active material comprise a plurality of organic light emitting diode (OLED) lighting elements.

3. The lighting structure of claim 1, wherein the at least one sheet of light active material comprise a plurality of inorganic light emitting diode (ILED) lighting elements.

4. The lighting structure of claim 1, wherein the fastening element comprises a bead chain.

5. The lighting structure of claim 1, wherein the fastening element comprises a clip element.

6. The lighting structure of claim 5, wherein the clip element further comprises:
   a substantially u-shaped unitary body portion having two opposedly positioned lateral ends; and
   first and second dimplet portions, the first dimplet portion positioned along a first interior surface at a first lateral end of the unitary body portion and the second dimplet portion positioned along a second interior surface at a second lateral end of the unitary body portion in oppositional proximity to one another.

7. The lighting structure of claim 5, wherein the fastening element comprises an end clip having a plurality of grooves into which corresponding ones of a plurality of edges of the at least one sheet of light active material fit snugly.

8. The lighting structure of claim 1, wherein the fastening element is a self-adhesive adhesive element.

9. The lighting structure of claim 1, further comprising a folding element retention element that retains in position a fold of the at least one sheet along the at least one folding element.

10. The lighting structure of claim 9, wherein the folding element retention element comprises a heat or laser weld of the at least one sheet along the at least one folding element.

11. The lighting structure of claim 9, wherein the folding element retention element comprises a mechanical attachment along the at least one folding element.

12. The lighting structure of claim 11, wherein the mechanical attachment comprises staples along the at least one folding element.

13. The lighting structure of claim 11, wherein the mechanical attachment comprises glue along the at least one folding element.

14. The lighting structure of claim 11, wherein the mechanical attachment comprises a self-adhesive fastener along the at least one folding element.

15. The lighting structure of claim 1, wherein the three-dimensional lighting structure is formed from one sheet of light active material housing the plurality of lighting elements, having a plurality of folding elements, and the power supply element is a single power cord that provides power to the plurality of lighting elements.

16. The lighting structure of claim 15, wherein the fastening element further comprises:
   a tab portion formed along an edge of the one sheet of light active material;
   a slot portion of the one sheet to receive the tab portion when the one sheet is folded along the at least one folding element to mate the tab portion to the slot portion.

17. The lighting structure of claim 1, wherein the three-dimensional lighting structure comprises a plurality of sheets of light active material including the at least one non-rigid, flexible, foldable sheet of light active material, with each sheet of light active material having a plurality of lighting elements and configured to be powered by a power cord of the power supply element.

18. The lighting structure of claim 1, wherein removal of the fastening element permits the at least one sheet of the light active material of the three-dimensional lighting structure to collapse into a substantially two-dimensional form.

19. The lighting structure of claim 1, wherein the center element is coupled to a substantially rigid backing configured to mount the three-dimensional lighting structure on a surface.

20. The lighting structure of claim 1, further comprising:
   a substantially rigid backing to which the center element of the three-dimensional lighting structure is coupled, the substantially rigid backing configured to mount the three-dimensional lighting structure on a surface.

21. A three-dimensional lighting structure, comprising:
   a plurality of sheets of light active material including at least one non-rigid, flexible, foldable sheet of light active material and at least one substantially rigid sheet of light active material to which other non-rigid, flexible, foldable sheets of the plurality of sheets of light active material are coupled, with each sheet of light active material being a sheet of light transmitting material having a plurality of lighting elements that are sandwiched between two or more laminate layers of the each sheet of light active material and that comprise emissive electroluminescent material and having circuitry coupled to the plurality of light elements within;

at least one folding element of the plurality of sheets of light active material, with a collapsible three-dimensional lighting structure formed of the plurality of sheets of light active material and the at least one folding element;

a power supply element to provide power to the circuitry coupled to the plurality of lighting elements of the plurality of sheets of light active material; and a fastening element coupled to the plurality of sheets of light active material at at least one fastening point of the plurality of sheets of light active material, wherein the collapsible three-dimensional lighting structure is removably retained in a three-dimensional form by the fastening element;

wherein a center element is a portion of the at least one substantially rigid sheet of light active material located and coupled at a back side of the three-dimensional lighting structure and forms a substantially rigid backing of the three-dimensional lighting structure.

22. A method of creating a three-dimensional lighting structure, comprising:

folding at least one non-rigid, flexible, foldable sheet of light active material along at least one folding element to create a collapsible three-dimensional lighting structure having a center element of the at least one non-rigid, flexible, foldable sheet of light active material located and coupled at a back side of the three-dimensional lighting structure, with each sheet of light active material being a sheet of light transmitting material comprising a plurality of lighting elements that are sandwiched between two or more laminate layers of the each sheet of light active material and that comprise emissive electroluminescent material and having circuitry coupled to the plurality of light elements; and removably retaining the three-dimensional lighting structure by activating a fastening element to retain the three-dimensional lighting structure created by folding the at least one sheet of light active material along the at least one folding element.

23. The method of claim 22, wherein the fastening element is coupled to the center element of the collapsible three-dimensional lighting structure.

24. The method of claim 22, further comprising mounting the center element of the three-dimensional lighting structure to a surface.

25. The method of claim 24, further comprising:
coupling the center element of the three-dimensional lighting structure to a substantially rigid backing, the substantially rigid backing configured to mount to the surface.

26. The method of claim 22, further comprising:
providing power to the circuitry coupled to the plurality of lighting elements of the at least one sheet of light active material.

27. The method of claim 22, powering the lighting elements of the at least one sheet with a power supply element.

28. The method of claim 22, further comprising:
collapsing the three-dimensional lighting structure into a substantially two-dimensional by de-activating the fastening element.

29. A method of creating a three-dimensional lighting structure, comprising:

folding at least one non-rigid, flexible, foldable sheet of light active material of a plurality of sheets of light active material along at least one folding element to create a collapsible three-dimensional lighting structure, the plurality of sheets of light active material being sheets of light transmitting material;

attaching the collapsible three-dimensional lighting structure to a substantially rigid sheet of light active material of the plurality of sheets of light active material, the substantially rigid sheet of light active material having a center element that is a portion of the at least one substantially rigid sheet of light active material located and coupled at a back side of the three-dimensional lighting structure and forms a substantially rigid backing of the three-dimensional lighting structure configured to couple the three-dimensional lighting structure to a surface; and removably retaining the three-dimensional lighting structure by activating a fastening element to retain the created three-dimensional lighting structure.

30. A method of manufacturing a three-dimensional lighting structure, comprising:

providing at least one non-rigid, flexible, foldable sheet of light active material, with each sheet of light active material being a sheet of light transmitting material comprising a plurality of lighting elements that are sandwiched between two or more laminate layers of the each sheet of light active material and that comprise emissive electroluminescent material and having circuitry coupled to the plurality of light elements;

providing the at least one non-rigid, flexible, foldable sheet of light active material with at least one folding element along which the at least one non-rigid, flexible, foldable sheet of light active material are foldable to create the three-dimensional lighting structure, the at least one non-rigid, flexible, foldable sheet of light active material having a center element located and coupled at a back side of the three-dimensional lighting structure; and providing a fastening element to removably retain a collapsible three-dimensional lighting structure created when the at least one sheet of light active material are folded along the at least one folding element.

31. The method of claim 30, further comprising:
sealing the edges of the at least one non-rigid, flexible, foldable sheet of light active material.

32. The method of claim 30, further comprising:
mounting the center element of the three-dimensional lighting structure to a surface.

33. The method of claim 32, further comprising:
coupling the center element of the three-dimensional lighting structure to a substantially rigid backing, the substantially rigid backing configured to mount to the surface.

34. The method of claim 32, the center element of the three-dimensional lighting structure a substantially rigid sheet of light active material to which the at least one non-rigid, flexible, foldable sheet of light active material is coupled and configured to couple the three-dimensional lighting structure to the surface.

35. A method of manufacturing a three-dimensional lighting structure, comprising:

providing at least one non-rigid, flexible, foldable sheet of light active material of a plurality of sheets of light active material and at least one substantially rigid sheet of light active material of the plurality of sheets of light active material to which the at least one non-rigid, flexible foldable sheet of light active material is coupled, with each sheet of light active material of the plurality of sheets light active material being a sheet of light transmitting material comprising a plurality of lighting elements that are sandwiched between two or more laminate layers of the each sheet of light active material and that comprise emissive electroluminescent material and having circuitry coupled to the plurality of light elements and with the at least one substantially rigid sheet of light active material having a center element located and coupled at a back side of the three-dimensional lighting structure;

providing the at least one non-rigid, flexible, foldable sheet of light active material with at least one folding element along which the at least one non-rigid, flexible, foldable sheet of light active material are foldable to create the three-dimensional lighting structure; and providing a fastening element to removably retain a collapsible three-dimensional lighting structure created when the at least one sheet of light active material are folded along the at least one folding element.

* * * * *